United States Patent
Macua et al.

(10) Patent No.: US 7,747,376 B2
(45) Date of Patent: Jun. 29, 2010

(54) METHOD FOR MONITORING A CONTROL CIRCUIT AND ACTUATING DEVICE

(75) Inventors: Eugenio Macua, Pamplona (ES); Christophe Ripoll, Viroflay (FR)

(73) Assignee: Renault s.a.s., Boulogne Billancourt (FR)

( * ) Notice: Subject to any disclaimer, the term of this patent is extended or adjusted under 35 U.S.C. 154(b) by 381 days.

(21) Appl. No.: 11/577,455

(22) PCT Filed: Oct. 18, 2005

(86) PCT No.: PCT/FR2005/050861
§ 371 (c)(1),
(2), (4) Date: Feb. 21, 2008

(87) PCT Pub. No.: WO2006/042998

PCT Pub. Date: Apr. 27, 2006

(65) Prior Publication Data
US 2008/0262696 A1    Oct. 23, 2008

(30) Foreign Application Priority Data
Oct. 18, 2004    (FR) .................................. 04 11007

(51) Int. Cl.
G06F 19/00     (2006.01)
F02D 41/20     (2006.01)
G08B 29/00     (2006.01)
H01H 47/00     (2006.01)

(52) U.S. Cl. ........................ 701/103; 701/104; 701/114; 340/510; 361/152

(58) Field of Classification Search .................. 123/478, 123/480, 490; 701/101–105, 114; 251/129.01, 251/129.08, 129.15; 310/316, 317; 361/152, 361/154; 340/510
See application file for complete search history.

(56) References Cited

U.S. PATENT DOCUMENTS

| 4,395,621 A | * | 7/1983 | Parker ........................ 219/492 |
| 4,410,882 A | * | 10/1983 | Claussen .................... 340/510 |
| 5,045,766 A | | 9/1991 | Vermersch |
| 6,621,301 B1 | * | 9/2003 | Mattes et al. ................. 326/86 |
| 6,850,394 B2 | * | 2/2005 | Kim ............................ 361/42 |

FOREIGN PATENT DOCUMENTS

| DE | 102 32 742 | 2/2004 |
| FR | 2 846 808 | 5/2004 |

* cited by examiner

Primary Examiner—Willis R Wolfe, Jr.
(74) Attorney, Agent, or Firm—Oblon, Spivak, McClelland, Maier & Neustadt, L.L.P.

(57) ABSTRACT

A method for monitoring a control circuit of an actuating device with at least one actuator including an actuated part and an electric member controlling movement of the actuated part, the control circuit including a bridge, the controlling electric member being connected in the bridge. The method includes: powering the bridge, producing at least one measurement signal representing the position of the actuated part, and selectively interrupting conduction in at least one branch of the bridge in accordance with the measurement signal to maintain the measurement signal substantially in an operating zone defined between a low threshold and a high threshold during a phase activating the controlling electric member. Conduction is interrupted in at least one branch to place the controlling electrical member in short-circuit via two branches of the bridge when the measurement signal reaches at least one specific threshold above the low threshold.

8 Claims, 5 Drawing Sheets

METHOD FOR MONITORING A CONTROL CIRCUIT AND ACTUATING DEVICE

The invention relates to the field of fuel-injection control for internal combustion engines designed, for example, to be fitted to an automobile vehicle.

The invention relates more particularly to a fuel-injection control allowing the injected fuel to be atomized in the form of very fine droplets.

Fuel-injection devices currently used on internal combustion engines equipping automobile or transport vehicles conventionally operate on the model of a valve whose open or closed state is continuously controlled, the proportion of fuel injected therefore being controlled directly by the open time.

Such infection systems comprise an electrical fuel supply pump which supplies, via the duct of a distribution manifold, all the injectors under a pressure exhibiting a constant difference with the pressure existing in the intake manifold thanks to a pressure regulator. By electronically controlling the electromagnet actuating the inlet valve of each injector, the start and the open time of the latter are controlled and then a precise fuel flow rate is determined for each of the injectors. Thus, the quantity of fuel injected depends solely on the open time of the electroinjectors.

Injectors of the needle-valve type with electromagnetic control, which are the most widely employed, do however have limits which hinder improvements in the performance of engines, notably as regards antipollution measures. En particular, the times taken to open or close the needle valves are still too long, around 1 to 2 ms, which prevents the injection from being correctly distributed over the entire open time of the inlet valve. Moreover, the minimum open time, which determines the minimum proportion of fuel that can be injected, is still to long for certain operating conditions of the engine.

The known needle-valve injectors furthermore have injection orifices of relatively large diameter in order to allow the required quantities of fuel to flow for the operation of engines under full load and at high speeds. This configuration generates fuel jets exhibiting large diameter droplets which hinders the vaporization of the fuel (and hence the formation of air-fuel mixture) and is able to promote the 'sidewall wetting' phenomenon.

This effect is because of the tendency of the nonvaporized fuel to deposit onto the sidewalls of the intake duct or of the combustion chamber in direct injection mode. Such a deposition leads to proportioning problems which are particularly acute during transient phases owing to the lack of knowledge of the amount of fuel effectively entering the corresponding combustion chamber. This phenomenon of sidewall wetting is one of the major causes of the high emission of pollutants during engine cold starts.

Furthermore, with a conventional needle-valve injector, at the time of opening of the valve needle, when the latter begins to leave its seat, a rubble of liquid is formed that disappears when the needle is completely raised, the flow of fluid then becoming normal. This change in the characteristics of the flow makes any precise control of the instantaneous flow of the injector impossible.

Some research groups have sought to solve these various problems by developing injectors that use piezoelectric actuators to maneuver the needle valve so as to reduce the opening and closing times of the needle, but such systems, which still operate according to the valve principle, retain the serious drawbacks notably associated with the significant dispersion affecting the size of the droplets in the fuel jet at the exit of the injector nozzle.

All of the aforementioned problems therefore result in a vaporization of the fuel that can be incomplete and nonhomogeneous, with imprecise air-fuel proportions when the air-fuel mixture is prepared in the combustion chamber, consequently leading to incomplete combustion resulting in the formation of a high quantity of polluting gases and a power deficit that alters the efficiency of the engine.

The document FR-A-2 801 346 describes a fuel-injection device for internal combustion engine equipped with an injector comprising a nozzle which is supplied with fuel and at the end of which there is an injection orifice, means for periodic vibration of the nozzle such as a transducer whose period and intensity are controlled by the electronic engine control system, and shuttering means retracted by elastic retraction means against the end of the nozzle said elastic retraction means being formed by a rod passing through the body of the injector as far as a cavity situated at the opposite end with respect to the injection orifice, said rod cooperating with a weight and damping means lodged within said cavity the vibrating of the nozzle and shuttering means providing the ejection of a predetermined quantity of fuel.

The document FR-A-2 846 808 describes an actuation device fitted with an actuator, with an actuator control electronic topology comprising a bridge circuit with a DC source between the first and second terminals of the circuit, the actuator being connected between the third and fourth terminals of the circuit, having a switch connected between the first and third terminals and a switch connected between the second and fourth terminals. The bridge circuit also has a first diode connected between the first and fourth terminals and a second diode connected between the second and third terminals. Such an actuation device is relatively simple. However, the need has arisen for an improvement in the precision of the position control.

The method for controlling a drive circuit is designed for an actuation device equipped with at least one actuator having an actuated part and an electrical mechanism for controlling the displacement of the actuated part, the drive circuit comprising a bridge, the electrical control mechanism being connected into said bridge.

The method comprises the steps consisting in:

powering the bridge producing at least one measurement signal representative of the position of the actuated part selectively interrupting the conduction in at least one branch of the bridge as a function of the measurement signal in order to maintain it substantially within a predefined region of operation between a lower threshold and an upper threshold during an activation phase of the electrical control mechanism and in which:

the conduction is interrupted in at least one branch in such a manner as to place the electrical control mechanism in short-circuit by means of two branches of the bridge when the measurement signal reaches at least one predetermined threshold situated above the lower threshold.

A current with a form close to sinusoidal can thus be obtained in the electrical control mechanism.

In one embodiment of the invention, the electrical control mechanism is placed in short-circuit when the measurement signal reaches or exceeds said predetermined threshold.

In one embodiment of the invention, the electrical control mechanism is placed in short-circuit when the measurement signal falls below said predetermined threshold.

In one embodiment of the invention, the electrical control mechanism is placed in short-circuit when the measurement signal reaches the upper threshold.

In one embodiment of the invention, the electrical control mechanism is placed in short-circuit when the measurement signal passes an intermediate threshold situated between the upper threshold and the lower threshold.

In one embodiment of the invention, the conduction is interrupted in at least one branch as a function of a timebase signal.

In one embodiment of the invention, the conduction is interrupted in at least one branch in such a manner as to apply the power supply to the terminals of the electrical control mechanism such that the measurement signal returns to the operating region when the measurement signal is situated below the lower threshold and the timebase signal indicates one unit of time.

In one embodiment of the invention the conduction is interrupted in at least one branch in such a manner as to apply the power supply to the terminals of the electrical control mechanism such that the measurement signal returns to the lower threshold when the measurement signal is situated within the operating region and the timebase signal indicates one unit of time.

The present invention will be better understood upon reading the detailed description of some embodiments taken by way of nonlimiting example and illustrated by the appended drawings in which.

The invention provides an actuation device having an electronic topology for controlling an actuator with a simplified structure and control system. One or two reverse-biased diodes are used within a bridge circuit, which leads to a reduction in the number of active switches and a simplification of the control.

Figure 1:
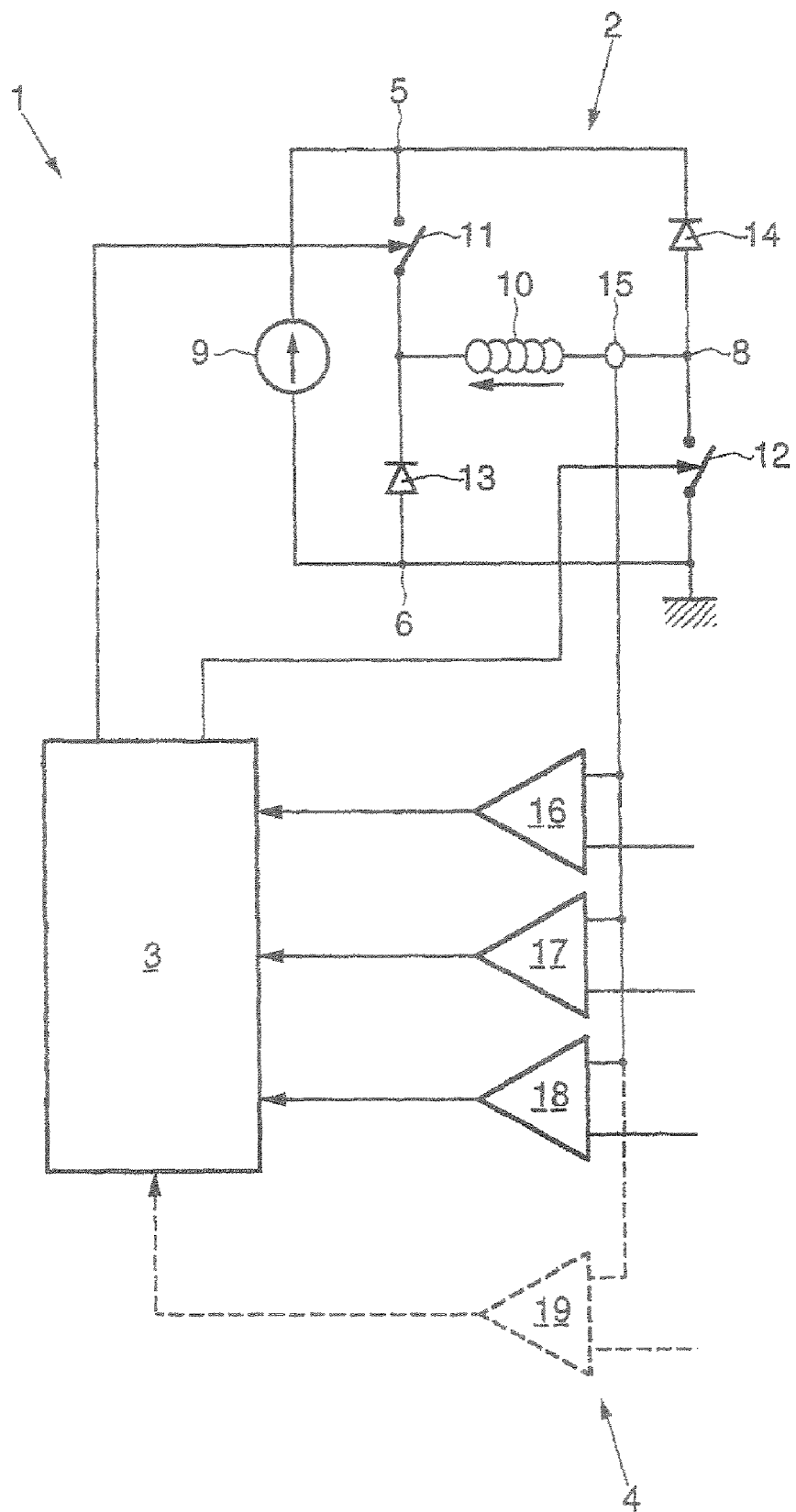
FIG. 1 is a circuit diagram of the actuation device according to one aspect of the invention.
Figure 2:
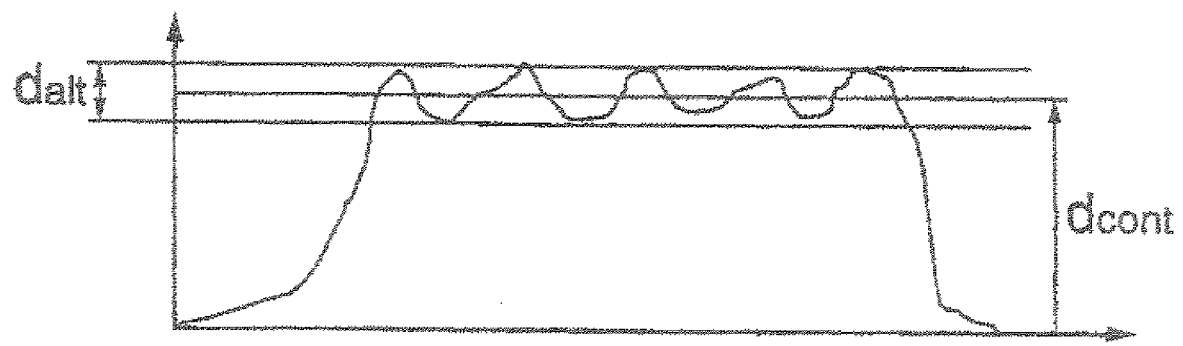
FIG. 2 is a plot versus time of the displacement of the device in FIG. 1.

As can be seen in FIG. 1, the actuation device 1 comprises a bridge circuit 2, a control unit 3 and a detection assembly 4.

The bridge circuit 2 comprises four terminals 5, 6, 7, 8, a DC voltage supply 9, for example a battery or an AC/DC power converter, connected to the first and second terminals 5 and 6 of the bridge 2 and delivers a DC voltage. As a variant, it may be provided for the supply 9 to deliver a constant current. The electrical control mechanism 10 allowing the actuator to be driven is connected between the third and fourth terminals 7 and 8 of the bridge circuit 5. In electrical terms, the electrical control mechanism 10 is equivalent to an inductor. A first switch 11 is connected between the first and third terminals 5 and 7 and a second switch 12 is connected between the second and fourth terminals 6 and 8. The bridge circuit 2 can be in the form of an integrated circuit in which the transistors of the MOS type are arranged which can be used as switches 11 and 12. Other types of switches may also be used such as IGBT transistors. The operation of the switches 11 and 12 is controlled by means of the control unit 3, to which the control terminals of said switches 11 and 12 are connected. The bridge circuit 2 also has first and second diodes 13 and 14. The first diode 13 is connected between the second and third terminals 6 and 7, the cathode of the diode 13 being connected to the third terminal 7. The second diode 14 is connected between the first and fourth terminals 5 and 8, the cathode of the second diode 14 being connected to the first terminal 5.

The use of diodes 13 and 14 simplifies the structure of the control unit 3 and the process for controlling the switches. The diodes 13 and 14 can be of any suitable type MOS transistors configured as diodes are preferably used in order to facilitate the integration of the control electronic topology and to reduce its cost.

The detection assembly 4 comprises a current probe 15 mounted on an electrical line disposed between the fourth terminal 8 and the electrical control mechanism 10. The current probe 15 could of course also be mounted between the third terminal 7 and the electrical control mechanism 10. The detection assembly 4 also comprises three comparators 16, 17 and 18, for example in the form of operational amplifiers, each having a first input connected to the output of the current probe 15 and an output connected to a dedicated input of the control unit 3. The second input of each comparator 16, 17, 18 is connected to a dedicated voltage reference 19, 20, 21, respectively, each supplying a high-level, a low-level and a very-low-level reference, respectively.

In the application of the method to an internal combustion engine injector, it is notably desired that a control sequence for the actuator be carried out as a function of time between a closed-off position of the injector and an injection setpoint position. The needle valve can be initially displaced from the closed-off position to the injection setpoint position with a maximum amplitude, then alternately displaced with a low amplitude $d_{alt}$ in a periodic manner. Later on, the needle can be returned to the closed-off position or be maintained at the injection setpoint position. It may also be envisioned that the alternating displacement does not immediately follow the displacement toward the injection setpoint position and that the needle valve be maintained for a certain period at the injection setpoint position.

Such a sequence can correspond either to an injection sequence, or to a sequence prior to the injection. The injection setpoint position could notably be an open position of the needle valve in the case where the alternating displacement is used during the injection. It may also be envisioned that the injection setpoint position be a closed-off position and that the alternating displacement with respect to the injection setpoint position be generated just before the opening of the needle valve.

Figure 3:
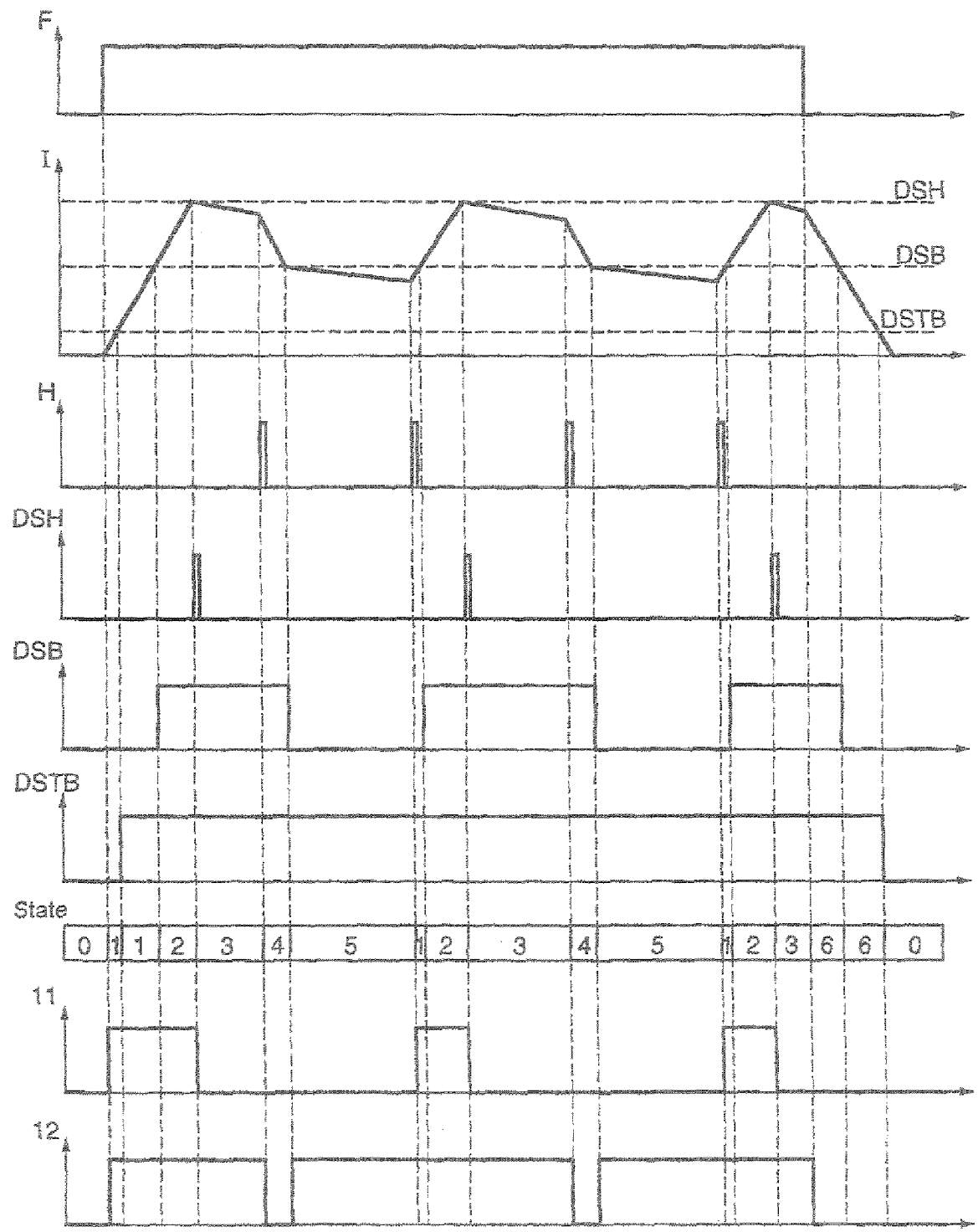
FIG. 3 is a timing diagram of the various signals of the device in FIG. 1.

FIG. 3 illustrates the timing diagrams of various control signals applied by the control unit 3 and the signals applied to the terminals of the electrical control mechanism 10. The electrical control mechanism 10 is electrically equivalent to an inductor. The electrical DC source 9 applies a DC potential. The voltage level applied to the gates of the transistors forming the switches 11 and 12 corresponds to their switching positions.

During a first phase, the switches 11 and 12 are open and the current in the electrical control mechanism 10 is zero. In a second phase, there is a start-up command (signal F) and the switches 11 and 12 are closed by causing the corresponding transistor to conduct. The current then begins to rise. In a third phase, the comparator 18 detects that the very low threshold has been reached. In a third phase, the switches 11 and 12 remain closed and the comparator 17 detects that the low current threshold has been reached. The current continues to rise in a substantially linear manner. In the following phase, the comparator 16 detects that the high current threshold has been reached. The control unit 3 commands the switch 11 to open which causes the diode 13 to conduct. The current in the electrical control mechanism 10 decreases slowly. In the following phase, the control unit 3 receives a clock signal H and commands the switch 12 to open; this results in a rapid decrease in the current I that must then flow through the diodes 13 and 14.

Subsequently, the comparator 17 detects that the current has reached the low-level threshold. The control unit 3 then commands the switch 12 to close, which causes a slow decrease of the current in the electrical control mechanism 10. The two phases of slow decrease exhibit similar descending slopes. In the following phase, the control unit 3 receives a clock signal H and commands the switch 11 to close, which results in a rise in the current I. The comparator 17 detects that the current rises above the low-level threshold. The comparator 16 detects that the current rises above the high-level threshold. The control unit 3 then commands the switch 11 to open.

The four last phases may then be repeated a certain number of times.

As illustrated, the end of actuation control command occurs in a phase when the current is decreasing in the electrical control mechanism 10, the switch 11 being open and the switch 12 being closed. Upon receiving an end of actuation command, the control unit 3 commands the switch 12 to open which causes the diode 14 to conduct, the diode 13 already conducting. The current in the electrical control mechanism 10 then falls sharply. The comparator 17 detects when it falls below the low-level threshold. Then, the comparator 18 detects when it falls below the very-low-level threshold.

Figure 4:
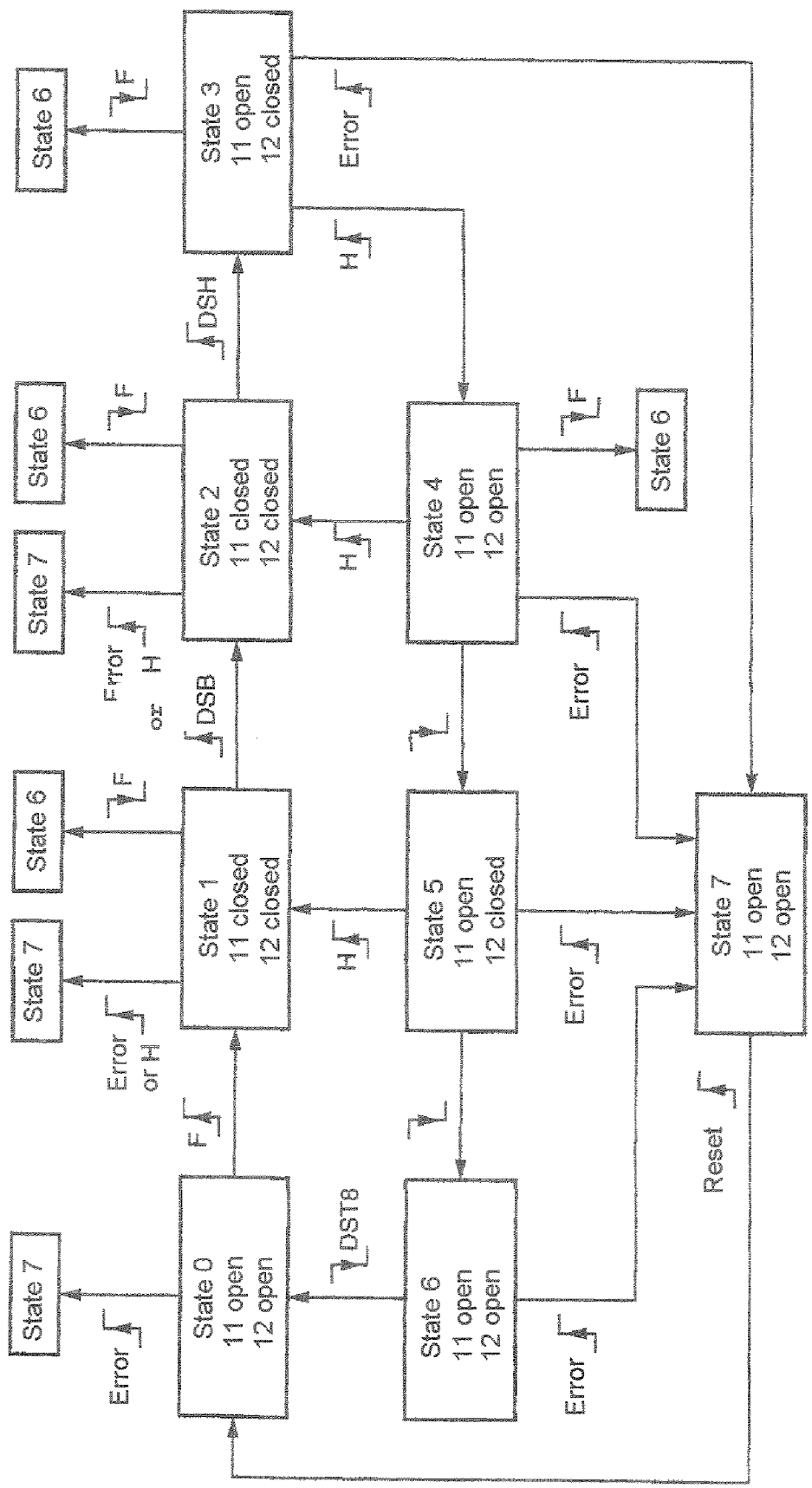
FIG. 4 is a state flowchart of the actuation device in FIG. 1.

The various states of the device are illustrated in FIG. 4. In state 0, the switches 11 and 12 are open. The device goes to state 1 at power-up. If an error is detected, a command sends it to state 7. In state 1, the switches 11 and 12 are closed. If turned off, the device goes to state 6. In the case of an error or of a clock signal H, the device goes to state 7. In the case of a detection of a rise above the low threshold DSB, the device goes to state 2. In state 2, the switches 11 and 12 are closed. If turned off, the device goes to state 6. In the case of an error or of a clock signal H, the device goes to state 7. In the case of a detection of a rise above the high threshold DSH, the device goes to state 3. In state 3, the switch 11 is open and the switch 12 is conducting. If turned off, the device goes to state 6. In the case of an error, the device goes to state 7. In the case of a clock signal H, the device goes to state 4.

In state 4, the switches 11 and 12 are open. In the case of a detection of a fall below the low-level threshold USE; the device goes to state 5. If turned off, the device goes to state 6. In the case of an error, the device goes to state 7. In the case of a clock signal H, the device goes back to state 2. In state 5, the switch 11 is open and the switch 12 is conducting. If turned off, the device goes to state 6.

In the case of an error, the device goes to state 7. In the case of a clock signal H, the device goes back to state 1.

In state 6, the switches 11 and 12 are open. In the case of a detection of a fall below the very low threshold DSTB, the device goes to state 0. In the case of an error, the device goes to state 7.

In state 7, the switches 11 and 12 are open. The device goes back to state 0 upon receiving a reset signal. The detection of the very low threshold makes it possible to pinpoint the moment when the current in the coil becomes zero after the end of the device start command. Thus, it suffices to wait until the very low current threshold has been crossed in order to subsequently restart the device. Operational errors are thus avoided, which enhances the reliability and the robustness of the device.

The invention allows the movement of the actuator to be controlled in a precise manner, which allows the fuel jet to be better divided up in the case of an injector and the fuel atomization to be improved during the injection.

Figure 5:
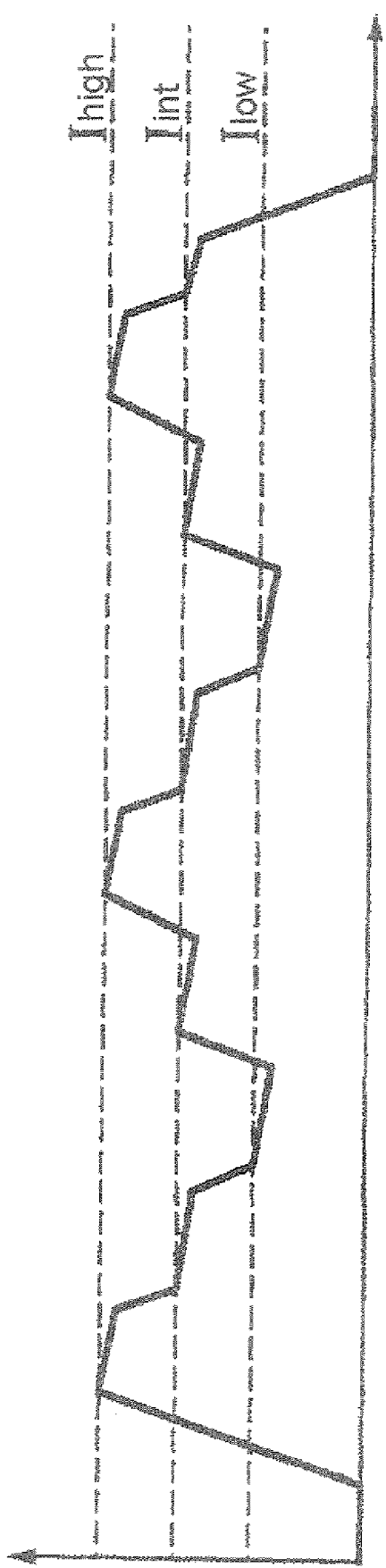
FIG. 5 is a plot versus time of the current in the actuator.

In FIG. 5, the waveform of the current I is illustrated with a three-level high, low and intermediate current control. An additional comparator 19, represented by the dashed line in FIG. 1, is provided in order to detect the intermediate current threshold. The waveform of the current is then close to sinusoidal.

The invention claimed is:

1. A method for controlling a drive circuit for an actuation device including at least one actuator with an actuated part and an electrical mechanism for controlling displacement of the actuated part, the drive circuit including a bridge, the electrical control mechanism being connected to the bridge, the method comprising:

powering the bridge;

producing at least one measurement signal representative of a position of the actuated part;

selectively interrupting conduction in at least one branch of the bridge as a function of the measurement signal to maintain the measurement signal substantially within a predefined region of operation between a lower threshold and an upper threshold during an activation phase of the electrical control mechanism;

wherein the conduction is interrupted in at least one branch as to place the electrical control mechanism in short-circuit by two branches of the bridge when the measurement signal reaches at least one predetermined threshold above the lower threshold.

2. The method as aimed in claim 1, wherein the electrical control mechanism is placed in short-circuit when the measurement signal reaches or exceeds the predetermined threshold.

3. The method as claimed in claim 1, wherein the electrical control mechanism is placed in short-circuit when the measurement signal falls below the predetermined threshold.

4. The method as claimed in claim 1, wherein the electrical control mechanism is placed in short-circuit when the measurement signal reaches the upper threshold.

5. The method as claimed in claim 1, wherein the electrical control mechanism is placed in short-circuit when the measurement signal passes an intermediate threshold between the upper threshold and the lower threshold.

6. The method as claimed in claim 1, wherein the conduction is interrupted in at least one branch as a function of a timebase signal.

7. The method as claimed in claim 1, wherein the conduction is interrupted in at least one branch so as to apply the power supply to terminals of the electrical control mechanism such that the measurement signal returns to the region of operation when the measurement signal is situated below the lower threshold and the timebase signal indicates one unit of time.

8. The method as claimed in claim 1, wherein the conduction is interrupted in at least one branch so as to apply the power supply to the terminals of the electrical control mechanism such that the measurement signal returns to the lower threshold when the measurement signal is within the region of operation and the timebase signal indicates one unit of time.

\* \* \* \* \*